United States Patent
Bischopink et al.

(10) Patent No.: US 9,035,413 B2
(45) Date of Patent: May 19, 2015

(54) SEMICONDUCTOR DEVICE WITH EMBEDDED CONVERTER ELEMENT AND PRODUCTION METHOD FOR A SEMICONDUCTOR DEVICE WITH AN EMBEDDED CONVERTER ELEMENT

(71) Applicant: Robert Bosch GmbH, Stuttgart (DE)

(72) Inventors: Georg Bischopink, Pliezhausen (DE); Silvia Kronmueller, Schwaikheim (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/032,340

(22) Filed: Sep. 20, 2013

(65) Prior Publication Data

US 2014/0084408 A1   Mar. 27, 2014

(30) Foreign Application Priority Data

Sep. 24, 2012   (DE) .......................... 10 2012 217 154

(51) Int. Cl.
| | | |
|---|---|---|
| *H01L 31/058* | (2006.01) | |
| *H01L 21/00* | (2006.01) | |
| *H01L 27/142* | (2014.01) | |
| *H01L 31/18* | (2006.01) | |
| *H01L 31/0475* | (2014.01) | |

(52) U.S. Cl.
CPC ........ *H01L 27/1422* (2013.01); *H01L 31/1876* (2013.01); *Y02E 10/50* (2013.01); *H01L 31/0475* (2014.12)

(58) Field of Classification Search
CPC ............ H01L 27/1422; H01L 31/1876; H01L 31/0475; Y02E 10/50

USPC ............................................ 257/470; 438/73
See application file for complete search history.

(56) References Cited

U.S. PATENT DOCUMENTS

| | | | |
|---|---|---|---|
| 6,576,556 B2 * | 6/2003 | Kimata et al. ................ 438/700 |
| 7,897,428 B2 * | 3/2011 | Assefa et al. ................... 438/98 |
| 8,673,756 B2 * | 3/2014 | Graham et al. ............... 438/584 |
| 2011/0221455 A1 * | 9/2011 | Feyh .............................. 324/661 |
| 2011/0278734 A1 * | 11/2011 | Yen et al. ...................... 257/774 |

(Continued)

FOREIGN PATENT DOCUMENTS

| | | |
|---|---|---|
| DE | 10 2006 028 435 A1 | 12/2007 |
| GB | 2 411 521 A | 8/2005 |

(Continued)

*Primary Examiner* — William D Coleman
(74) *Attorney, Agent, or Firm* — Maginot, Moore & Beck LLP

(57) ABSTRACT

A semiconductor device includes a carrier substrate having at least one conductor track, at least one converter element structured at least partly from a further semiconductor substrate, and conductive structures formed on a respective converter element. The at least one converter element is electrically linked to the at least one conductor track via at least one at least partly conductive supporting element arranged between a contact side of the carrier substrate and an inner side of the converter element. The inner side is oriented toward the carrier substrate. The at least one converter element is arranged on the contact side of the carrier substrate such that the inner side of the converter element is kept spaced apart from the contact side of the carrier substrate. The at least one converter element and the conductive structures formed thereon are completely embedded into at least one insulating material.

16 Claims, 8 Drawing Sheets

(56) References Cited

U.S. PATENT DOCUMENTS

2012/0228752 A1* 9/2012 Huang .......................... 257/660
2013/0119556 A1* 5/2013 Liu et al. ....................... 257/774

FOREIGN PATENT DOCUMENTS

| WO | 2011/107486 A1 | 9/2011 |
| WO | 2011/107487 A1 | 9/2011 |

* cited by examiner

SEMICONDUCTOR DEVICE WITH EMBEDDED CONVERTER ELEMENT AND PRODUCTION METHOD FOR A SEMICONDUCTOR DEVICE WITH AN EMBEDDED CONVERTER ELEMENT

This application claims priority under 35 U.S.C. §119 to patent application no. DE 10 2012 217 154.1, filed on Sep. 24, 2012 in Germany, the disclosure of which is incorporated herein by reference in its entirety.

BACKGROUND

The disclosure relates to a semiconductor device. Furthermore, the disclosure relates to a production method for a semiconductor device.

WO 2011/107487 A1 describes a semiconductor device and a method for producing the semiconductor device. The semiconductor device comprises a plurality of optical sensor elements, the semiconductor regions of which are structured from an SOI substrate. Each of the optical sensor elements is fixed to a carrier substrate via a supporting element composed of a metal and a bonding connection.

SUMMARY

The disclosure provides a semiconductor device and a production method for a semiconductor device.

Complete embedding of the at least one semiconductor region of the at least one converter element and of the conductive structures formed on the at least one converter element into at least one insulating material can be understood to mean that the at least one semiconductor region and the conductive structures which make (direct) contact with the at least one semiconductor region and which are oriented substantially parallel to the at least one semiconductor region are completely embedded into the at least one insulating material. This can also be defined as a complete (all-around) surface passivation of the at least one converter element.

The complete embedding of the at least one converter element and of the conductive structures formed thereon into the at least one insulating material reliably prevents the occurrence of short circuits and/or leakage currents in the semiconductor device according to the disclosure. The passivation—which can be realized by means of the present disclosure—of the at least one converter element and of the conductive structures formed thereon, in particular of leads between the at least one converter element and the carrier substrate, thus makes it possible advantageously to increase a reliability of the semiconductor device according to the disclosure.

As will be explained in greater detail below, the present disclosure enables, in particular, an advantageous passivation of surfaces of the at least one converter element which are oriented toward the carrier substrate. Disturbing surface leakage currents and/or an increased signal noise can be prevented in this way. A limited thermal resolution that often occurs in conventional semiconductor devices is thus inapplicable in the case of the semiconductor device according to the disclosure.

Moreover, by means of the production method according to the disclosure, as will be explained in even greater detail below, all structures can be produced by means of process steps with an etching stop. Consequently, a temporal limitation of the etching steps is inapplicable in the case of the production method according to the disclosure. This makes it possible to comply comparatively precisely with structural dimensions of the at least one converter element even during mass production thereof. The production method according to the disclosure can thus be used for rapidly and cost-effectively producing semiconductor devices in mass production.

Preferably, the at least one at least partly conductive supporting element comprises at least one bonding connection. The at least one converter element can thus be arranged fixedly on the carrier substrate in a comparatively simple manner.

In one advantageous embodiment, the structures formed on the at least one converter element are formed on a side of the at least one semiconductor region of the assigned converter element which is oriented toward the carrier substrate. This ensures an additional protection of said structures.

By way of example, the at least one converter element can be embodied as optical sensor element and/or image pixel. In particular, the at least one converter element can comprise at least one diode for temperature measurement. By means of the production method according to the disclosure, such a semiconductor device is producible cost-effectively, in a simple manner and with an advantageously high yield in mass production.

In one preferred embodiment, the at least one converter element comprises in each case a plurality of quantum films oriented such that the maximum interfaces of the quantum films are oriented perpendicularly to the contact side and/or an outer surface of the carrier substrate, said outer surface being oriented toward the at least one converter element. As will be explained in greater detail below, in this case the quantum films can be structured from a single deposited layer.

As an alternative or in combination with the embodiment described previously, the at least one converter element can comprise an absorber layer formed on an outer side of the assigned converter element, said outer side being directed away from the carrier substrate. A converter element embodied in this way is also well suited as optical sensor element and/or image pixel.

The advantages explained above can also be realized by means of implementation of a corresponding production method. The production method can be developed further in particular in accordance with the embodiments and developments explained above.

BRIEF DESCRIPTION OF THE DRAWINGS

Further features and advantages of the present disclosure are explained below with reference to the figures, in which.

DETAILED DESCRIPTION

Figure 1A:
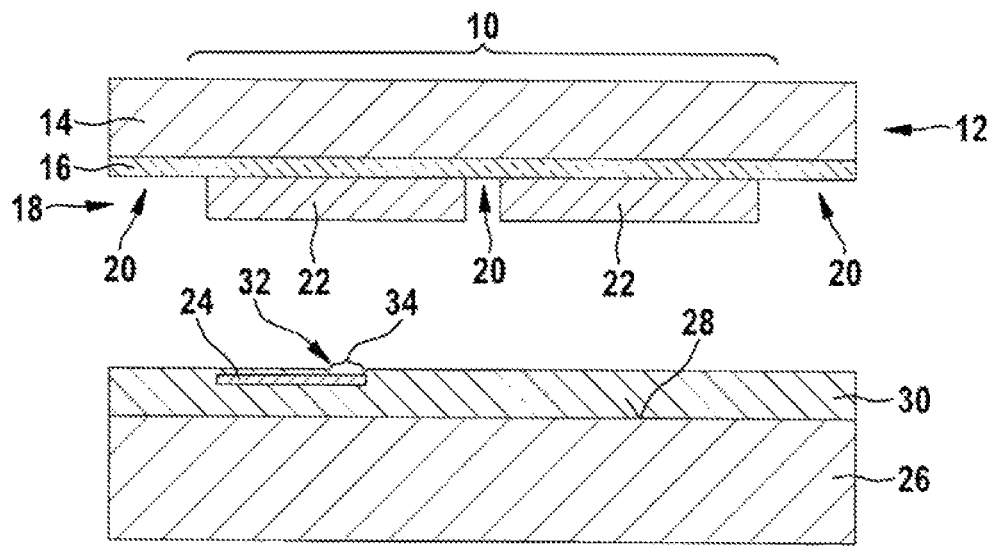
FIGS. 1A to 1I show schematic cross sections and plan views of substrates for elucidating a first embodiment of the production method.

FIGS. 1A to 1I show schematic cross sections and plan views of substrates for elucidating a first embodiment of the production method.

In the production method represented schematically by means of FIGS. 1A to 1I, at least one converter element 10 is structured at least partly from a semiconductor substrate 12. The at least one converter element 10 can be embodied for example as thermo-optical (IR) sensor element and/or image pixel as in the production method explained below. However, it is pointed out that the production method is not limited to one specific type of the at least one converter element 10. Instead, a multiplicity of differently embodied converter elements 10 can be formed by means of the production method described below.

In the case of the embodiment described here, the semiconductor substrate 12 is an SOI substrate (semiconductor-on-insulator) comprising a semiconductor wafer 14, a silicon dioxide layer 16 covering a surface of the semiconductor wafer 14, and a semiconductor layer 18 separated from the semiconductor wafer 14 by means of the silicon dioxide layer 16. The semiconductor layer 18 is preferably a monocrystalline silicon layer. However, the production method is not limited to the use of an SOI substrate as semiconductor substrate 12.

As illustrated in FIG. 1A, at least one semiconductor region 22 (semiconductor island) of the at least one later converter element 10 can be structured from the semiconductor layer 18 for example by means of etching a plurality of continuous cutouts 20. The use of an SOI substrate as semiconductor substrate 12 enables at least one monocrystalline semiconductor region 22 of the later at least one converter element 10. In this case, the at least one semiconductor region 22 of the later at least one converter element 10 has (virtually) no grain boundary noise, which generally restricts a thermal resolution of a conventional sensor element/image pixel composed of polycrystalline silicon. It is also possible to provide a plurality of semiconductor regions 22 for each converter element 10, as in the production method described here.

In an optional method step of the production method, at least one line 24 can be formed on a carrier substrate 26. The carrier substrate 26 can also comprise at least one semiconductor material, such as silicon, for example. The at least one line 24 is preferably embedded in an at least one insulating layer 30 applied on an outer side 28 of the carrier substrate 26. By means of forming/etching a cutout 32 into the at least one insulating layer 30, it is possible for only a contact region 34 of the at least one line 24, said contact region being used for later contact-making, to be freed of the insulating material of the at least one insulating layer 30. The result is shown in FIG. 1A.

Figure 1B:
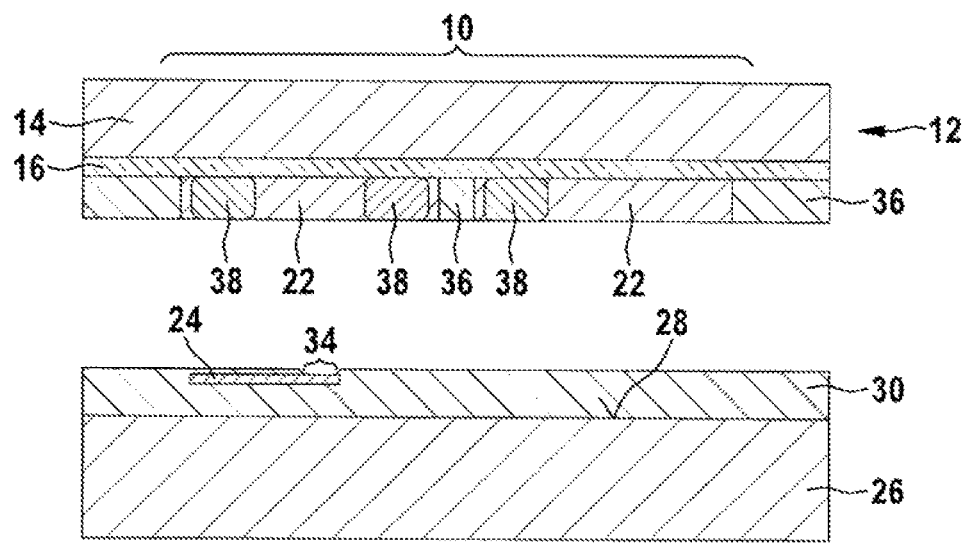

In a further method step for forming the at least one converter element 10, the continuous cutouts 20 structured into the semiconductor layer 18 can be filled with an insulating material 36, such as silicon dioxide, for example. Optionally an overhang of the at least one insulating material 36 can subsequently be removed by means of a planarization. In addition, dopings 38 can be introduced into the semiconductor regions 22 (semiconductor islands) of the later at least one converter element 10. At least partial regions of the semiconductor regions 22 of the later at least one converter element 10 can be made conductive by means of the dopings 38. The concentrations and ions of the dopings 38 can be chosen in a manner specific to a later intended use of the at least one converter element 10. FIG. 1B shows the semiconductor substrate 12 after the dopings 38 have been formed.

Figure 1C:
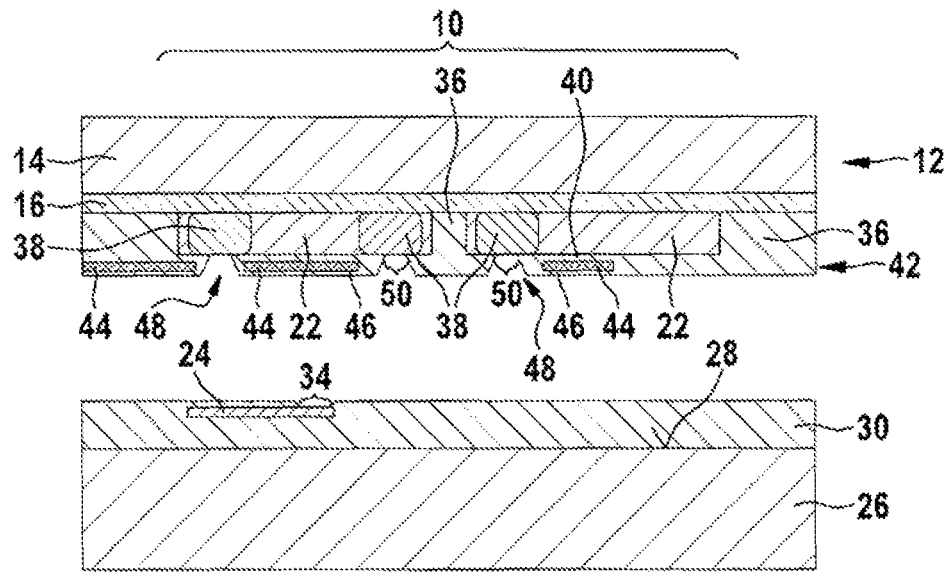

Optionally, a first intermediate insulating layer 40 can be applied on the semiconductor regions 22 of the later at least one converter element 10. Afterward, a sacrificial layer 42 can be deposited on the first intermediate insulating layer 40, from which sacrificial layer regions 44 are structured. If appropriate, the sacrificial layer regions 44 are completely covered with a second intermediate insulating layer 46. Cutouts 48 can subsequently be structured/etched through the intermediate insulating layers 40 and 46, said cutouts exposing partial areas 50 of the semiconductor regions 22, preferably at/near the dopings 38. The result is illustrated in FIG. 1C.

At least one metal is subsequently deposited on the partial areas 50 of the semiconductor regions 22 of the at least one converter element 10. In addition, partial surfaces of the second intermediate insulating layer 46 that are adjacent to the cutouts 48 are covered with the at least one metal in such a way that conductive structures 52 are formed on the at least one later converter element 10. The function of the conductive structures on the finished produced semiconductor device will also be discussed below.

Figure 1D:
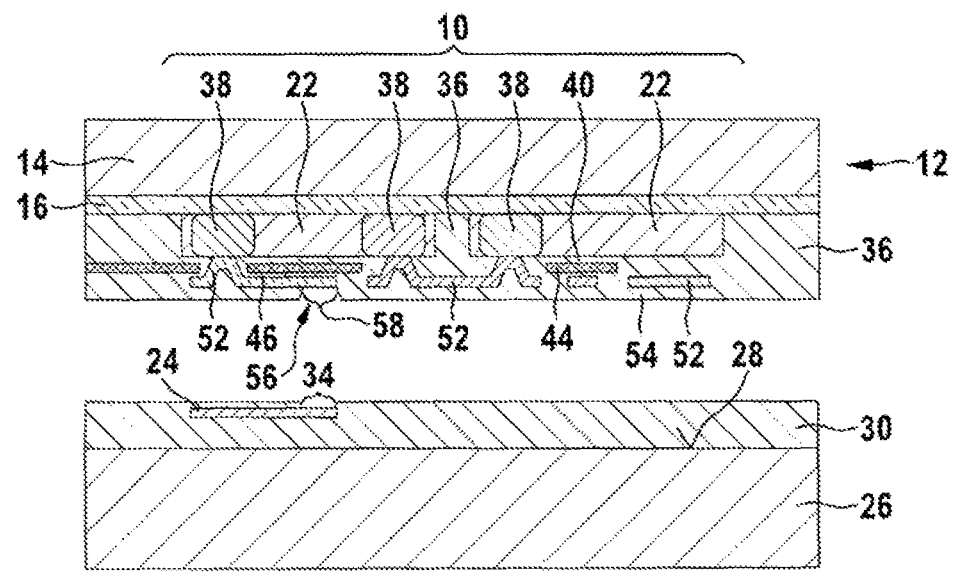

The conductive structures 52 are then completely covered by at least one external insulating layer 54. Afterward, at least one continuous cutout 56 can be structured/etched through the at least one external insulating layer 54, which exposes at least one contact region 58 of the conductive structures 52. FIG. 1D shows the semiconductor substrate 12 after the exposure of the at least one contact region 58 on the conductive structures 52. Optionally, etching holes 64 are also etched as far as the sacrificial layer regions 44, but they do not expose the conductive structures.

The at least one converter element 10 is linked to the at least one conductive track 24 at the carrier substrate 26 already mentioned above. In this case, the at least one converter element 10 is electrically linked to the at least one conductor track 40 via at least one conductive (intermediate) supporting element arranged between a contact side 60 of the carrier substrate 26 and an inner side 62 of the converter element 10, said inner side being oriented toward the carrier substrate 26. The at least one converter element 10 is arranged on the contact side 60 of the carrier substrate 26 via the at least one conductive (intermediate) supporting element in such a way that the inner side 62 of the converter element 10 is held spaced apart from the contact side 60 of the carrier substrate 26. This can also be paraphrased by stating that at least one air gap is present between the sides 60 and 62 after the at least one converter element 10 has been linked to the carrier substrate 26.

Figure 1E:
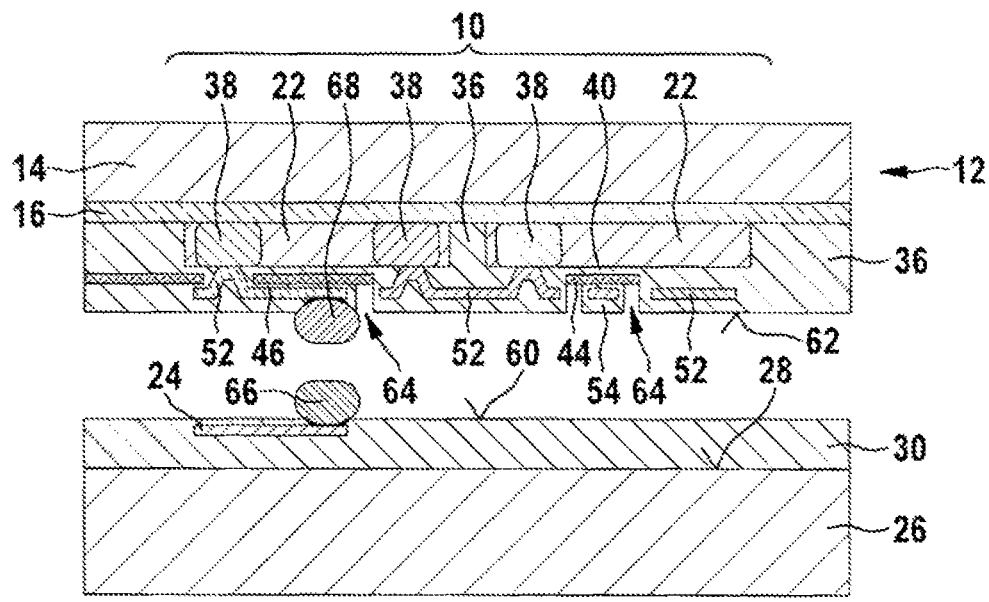

Preferably, the at least one converter element 10 is linked to the carrier substrate 26 by means of a bonding connection of the conductive (intermediate) supporting element. A bonding connection embodied as a bonding metallization can be formed from copper and tin, for example. For this purpose, copper 66 is deposited on the at least one contact region 34 of the at least one line 24 of the carrier substrate 26 and on a corresponding contact region 58 on the at least one converter element 10 of the conductive structures 52 formed on the at least one converter element 10. Tin 68 is subsequently deposited on at least one of the contact regions 34 and/or 58, as is illustrated in FIG. 1E.

Figure 1F:
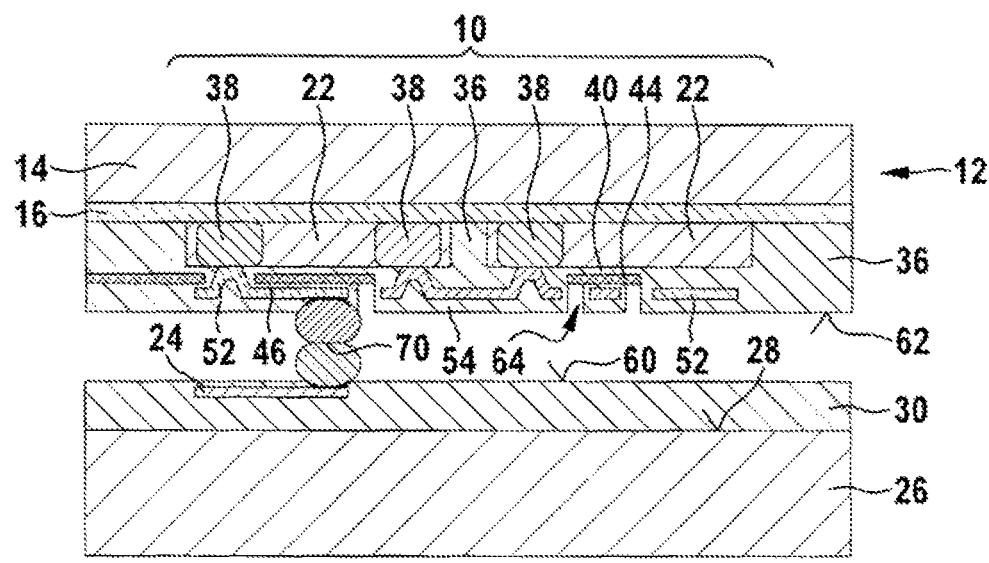

FIG. 1F shows the conductive (intermediate) supporting element embodied as a bonding metallization 70 between the at least one converter element 10 and the carrier substrate 26. As can also be discerned with reference to FIG. 1F, in the case of the embodiment of the production method as described here, the conductive structures 52 formed on the at least one converter element 10 are formed on a side of the at least one semiconductor region 22 of the assigned converter element 10 which is oriented toward the carrier substrate 26 when the at least one converter element 10 is linked to the carrier substrate 26. This ensures an additional protection of the conductive structures 52.

Figure 1G:
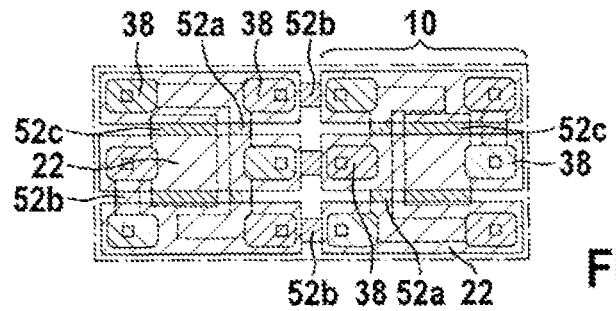

Optionally, after the at least one converter element 10 has been linked to the carrier substrate 26, the semiconductor wafer 14 can be etched back, in particular removed. FIG. 1G shows a schematic plan view of the intermediate product of the production method after removal of the semiconductor wafer 14, the silicon dioxide layer 16 not being illustrated for the sake of better clarity. The conductive structures 52 outlined comprise suspension structures 52a, wiring structures 52b and reflector structures 52c. A respective suspension structure 52a together with an assigned (intermediate) supporting element/a bonding metallization 70 forms a suspension/support of the assigned converter element 10, wherein the converter element 10, via at least two suspensions/supports, is mechanically connected to the carrier substrate 26 and electrically connected to at least two lines 24 of the carrier substrate 26. By means of at least one wiring structure 52b, at least two semiconductor regions 22 can be connected to one another. The reflector structures 52c improve the optical sensitivity of the finished converter element 10.

Figure 1H:
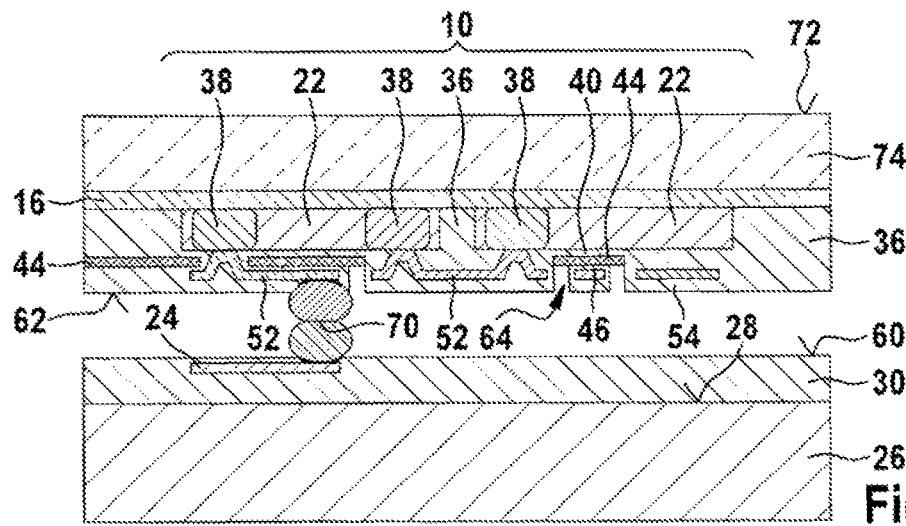

In a further optional method step, illustrated in FIG. 1H, an absorber layer 74 is formed on an outer side 72 of the at least one converter element 10, said outer side being directed away from the carrier substrate 26. Instead of or as an addition to the absorber layer 74, it is also possible to form absorber structures such as, for example, plasmonic resonance structures, photonic crystals and/or λ/4 resonators on the outer side 72.

Figure 1I:
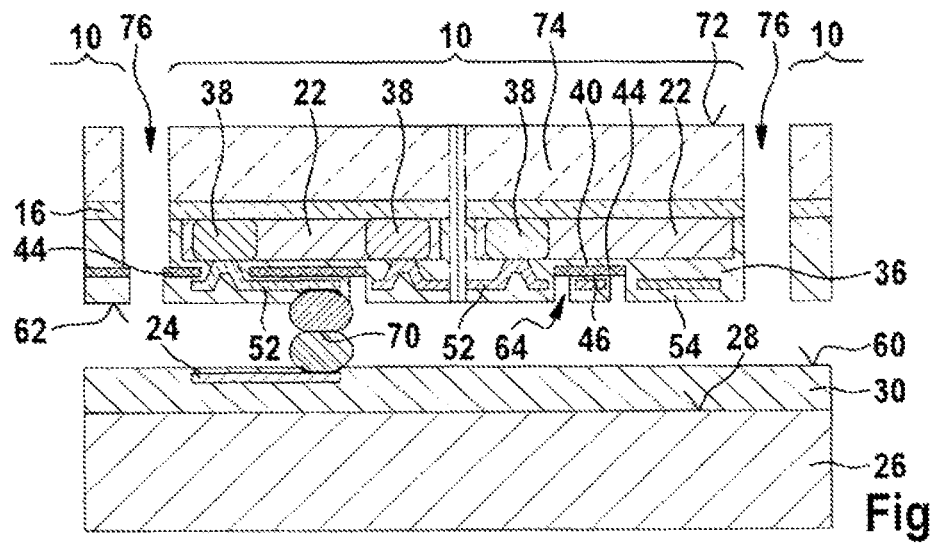

For releasing the at least one converter element 10, separating trenches 76 can be etched through the previous semiconductor substrate 12 and the layers 40, 46, 54 and 74 deposited thereon. The result is illustrated in FIG. 1I.

Figure 3:
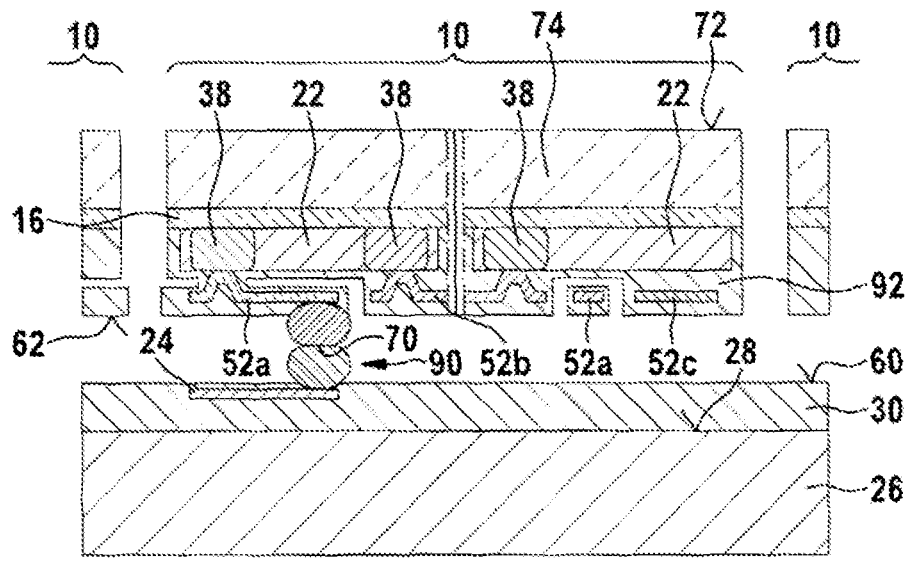
FIG. 3 shows a schematic illustration of a first embodiment of the semiconductor device.

In the regions in which sacrificial layer regions 44 are exposed during the etching of the separating trenches 76, said sacrificial layer regions are removed by subsequent sacrificial layer etching. The sacrificial layer etching can be performed using $XeF_2$ and/or $ClF_3$, for example. (The result of the sacrificial layer etching is illustrated in FIG. 3.)

It is pointed out that in the production method the at least one semiconductor region 22 and the at least one converter element 10 and the conductive structures 52 formed on the at least one converter element 10 are completely embedded into at least one insulating material (of the regions 36, 40, 46 and 54). This can be understood to mean, in particular, that only the at least one (intermediate) supporting element, preferably only the bonding metallization 70, is present in a manner not covered by the at least one insulating material after the end of the production method. The at least one insulating material can be silicon dioxide, for example. However, it is pointed out that the complete embedding of the at least one semiconductor region 10 and of the conductive structures 52 formed thereon is not restricted to the use of silicon dioxide. Instead of or as an addition to silicon dioxide, it is also possible to use some other insulating material for embedding/passivating the at least one converter element 10 and the conductive structures 52 formed thereon.

The complete embedding of the at least one semiconductor region 22 and of the conductive structures 52 formed on the at least one converter element into the at least one insulating material is preferably understood to mean that the at least one semiconductor region 22 of the at least one converter element 10 and the conductive structures 52 which directly make contact with/touch the at least one semiconductor region 22 and which are oriented substantially parallel to the at least one semiconductor region 22 are completely embedded into the at least one insulating material. This can therefore also be referred to as a complete (all-around) surface passivation of the at least one converter element 10. On account of the advantageous (all-around) surface passivation of the at least one converter element 10 and of the conductive structures 52 formed thereon, the at least one converter element 10 has better noise behavior compared with a conventional converter component during the later operation of said at least one converter element. In addition, the surface leakage currents that possibly occur during later operation of the at least one converter element 10 are reduced compared with those of a conventional converter component. As an additional advantage, an increased mechanical robustness of the later suspension structures 52a e.g. relative to high accelerations is afforded by the surface passivation.

In an optional further method step, the semiconductor device illustrated in FIG. 1I can be capped with a suitable cap wafer. The capping of the semiconductor device ensures that the latter is reliably protected against contaminants and/or ingress of liquids. A thermal insulation of the at least one converter element 10 with respect to an external environment is also possible by means of a suitable capping. Furthermore, it is possible to set a reduced pressure, in particular a vacuum, in a direct vicinity of the at least one converter element 10 by means of a capping. A reduced pressure, in particular a vacuum, enables a better thermal insulation of the at least one converter element 10 relative to the carrier substrate 26 and electronics possibly formed thereon.

FIGS. 2A to 2E show schematic cross sections of substrates for elucidating a second embodiment of the production method.

Figure 2A:
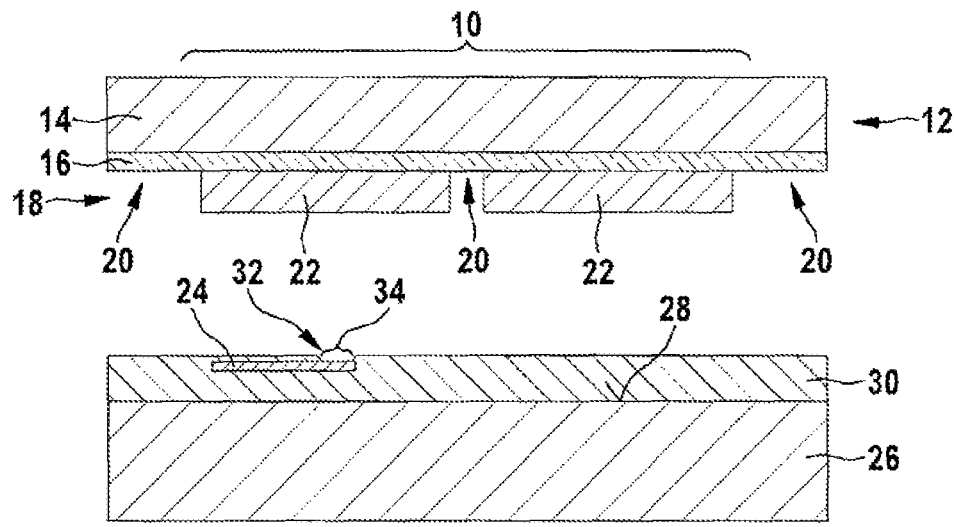
FIGS. 2A to 2E show schematic cross sections of substrates for elucidating a second embodiment of the production method.
Figure 2B:
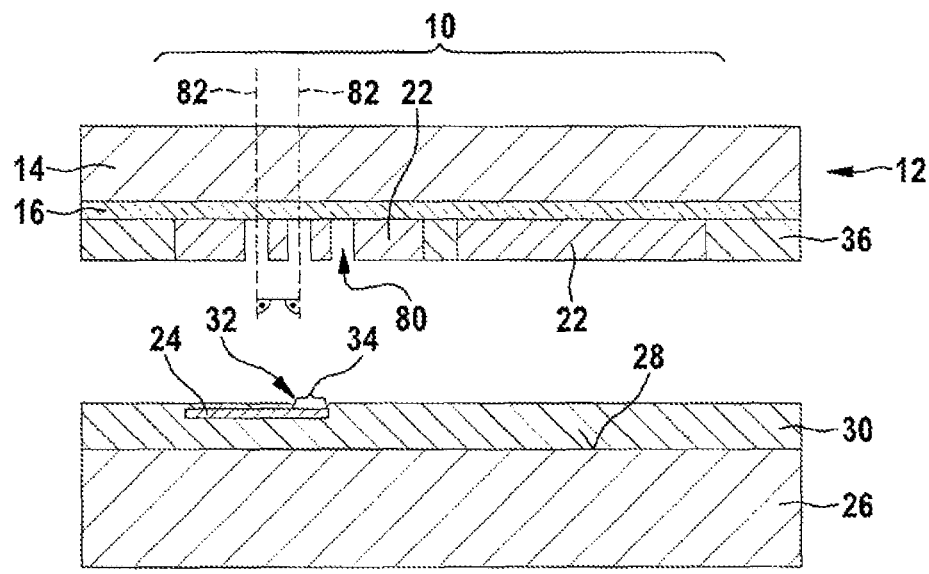

The intermediate product illustrated in FIG. 2A of the embodiment of the production method described here corresponds to the illustration of FIG. 1A. Therefore, with regard to the method steps to be performed in order to form this intermediate product, reference is made to the explanations above.

In the case of the production method in accordance with FIGS. 2A to 2E, in each case a plurality of quantum films are formed in the at least one converter element 10. For this purpose, after the continuous cutouts 20 have been filled with the at least one insulating material 36, a plurality of continuous trenches 80, the central longitudinal axes 82 of which are oriented parallel to one another, are etched through the at least one semiconductor region 22 of the at least one converter element 10.

Figure 2C:
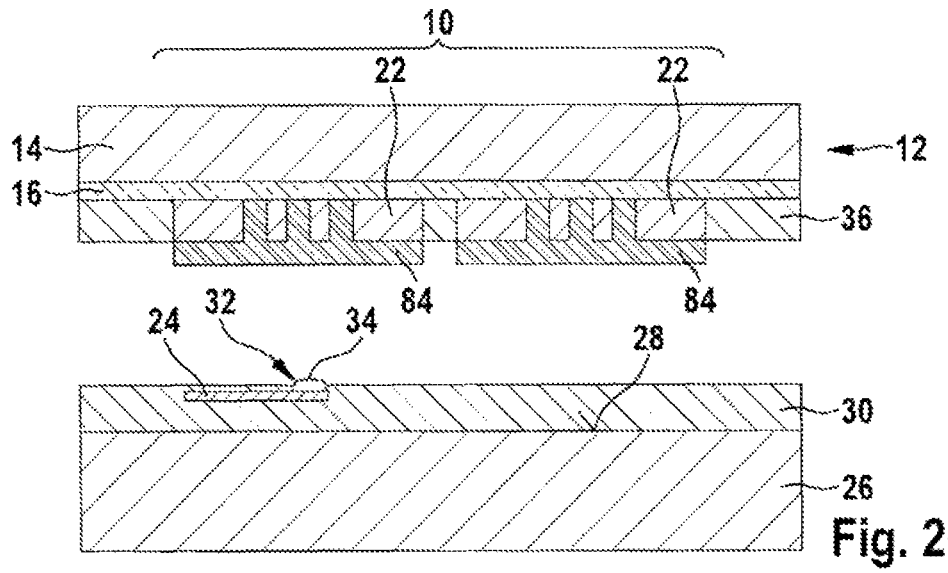

FIG. 2C shows the semiconductor substrate 12 after the continuous trenches 80 have been filled with a quantum film material 84. By way of example, silicon-germanium can be used as quantum film material 84. As an alternative or as an addition to silicon-germanium, however, it is also possible to use some other material as quantum film material 84.

Figure 2D:
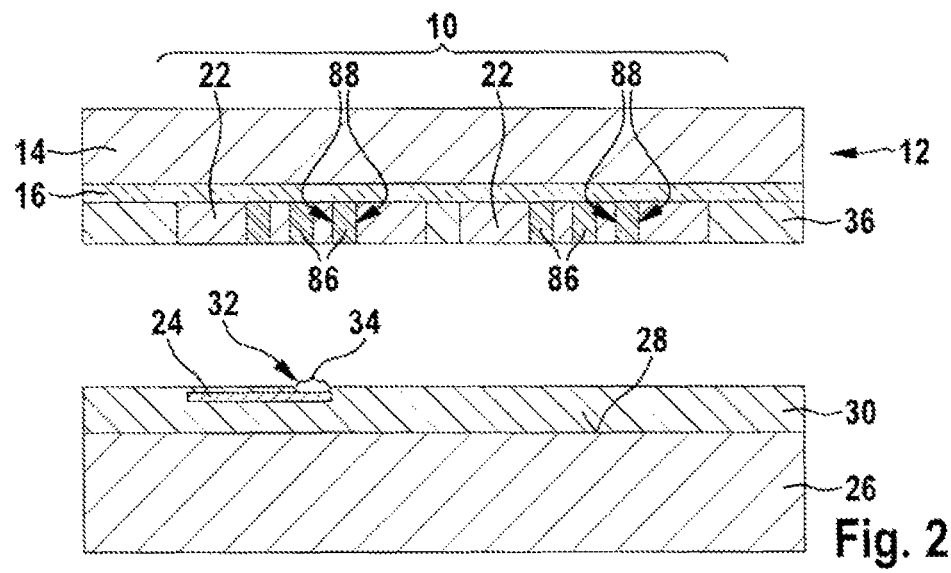

The quantum film material 84 is subsequently thinned back, for example by means of etching or chemical mechanical polishing. In this way, the overhangs of the quantum film material 84 projecting from the trenches 80 can be reliably removed. After the thinning back, the semiconductor regions 22 are equipped with a plurality of quantum films 86 (FIG. 2D).

It is pointed out that, by means of the method steps described above, a multiplicity of quantum films 86 can be formed in each case in a semiconductor region 22 of a converter element 10, only a single deposition of the quantum film material 84 being necessary. The method steps explained above therefore enable a multiplicity of quantum films 86 to be produced in a semiconductor region 22 of a converter element 10 more rapidly and cost-effectively than would be possible by sequentially successively depositing quantum well and quantum barrier layers.

Each of the quantum films 86 has two maximum interfaces 88. (The maximum interfaces 88 can be understood to mean, in particular, the contact areas of the quantum films 86 with respect to the sidewalls of the trenches 80/the adjacent semiconductor region 22.) During the production method in FIGS. 2A to 2E, the maximum interfaces 88 of the quantum films 86, when the at least one converter element 10 is linked to the carrier substrate 26, are oriented perpendicularly to the contact side 60 and/or the outer surface 28 of the carrier substrate 26, said outer surface being oriented toward the at least one converter element 10. This can also be paraphrased by stating that the central longitudinal axes 82 of the trenches 80 of the quantum films 86 are oriented perpendicularly to the contact side 60 and/or the outer surface 28 of the carrier substrate 26.

Figure 2E:
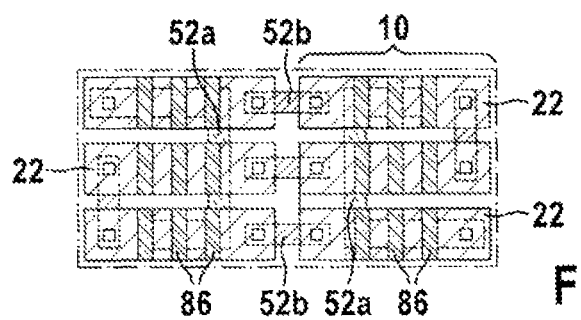

FIG. 2E shows a plan view of the converter element 10 fixed to the carrier substrate 26 by means of the procedure described above, a depiction of the semiconductor wafer 14 and of the insulating film 16 being dispensed with for the sake of clarity.

It is pointed out that the production methods explained above yield converter elements having a defined layer thickness of the semiconductor regions 22, and a defined lateral dimensioning of the converter elements 10. The semiconductor devices producible by means of the production methods therefore also have a defined thermal sensor mass. It is also pointed out that a size/extent of the semiconductor regions 22 is not fixed by a temporal duration of the etching steps to be performed. Consequently, the extents of the semiconductor regions 22 can be varied in a simple manner. The temperature-sensitive diodes producible as converter elements 10 are producible in a monocrystalline semiconductor material, and thus have improved noise behavior. In addition, a higher sensitivity of the finished semiconductor device can be achieved by a plurality of converter elements 10 being connected in series by means of the wiring structures 52b.

By means of the production methods explained above, it is possible to form semiconductor devices comprising an array of converter elements 10 which can be used as imaging components for detecting radiation. By way of example, characteristic thermal radiations from various objects, devices or living beings can be measured by means of the finished produced semiconductor devices. The finished produced semiconductor devices can also be used for monitoring temperature.

FIG. 3 shows a schematic illustration of a first embodiment of the semiconductor device.

The semiconductor device illustrated schematically in FIG. 3 is producible for example by means of the production method in FIGS. 1A to 1I. However, the producibility of the semiconductor device in FIG. 3 is not limited to said production method.

The semiconductor device comprises a carrier substrate 26 with at least one conductor track 24, and at least one converter element 10 having at least one semiconductor region 22 structured at least partly from a further semiconductor substrate, and having conductive structures 52 formed on the respective converter element 10. The at least one converter element 10 is electrically linked to the at least one conductor track 24 via at least one conductive supporting element 90 arranged between a contact side 60 of the carrier substrate 26 and an inner side 62 of the converter element 10, said inner side being oriented toward the carrier substrate 26, wherein the at least one converter element 10 is arranged on the contact side 60 of the carrier substrate 26 via the at least one conductive supporting element 90 in such a way that the inner side 62 of the converter element 10 is kept spaced apart from the contact side 60 of the carrier substrate 26.

The at least one converter element 10 comprises at least one (radiation-sensitive) thermal diode. A radiation impinging on at least one of the converter elements 10 results in heating of the at least one semiconductor region 22 of the respective converter element 10, and thus in a change in resistance in the at least one semiconductor region 22 affected. An impinging radiation can thus be detected, determined and/or measured by means of a current flow passed through the semiconductor regions 22.

The semiconductor device illustrated in FIG. 3 comprises suspension structures 52a, wiring structures 52b and reflector structures 52c as conductive structures 52 of the at least one converter element 10. A respective suspension structure 52a together with a bonding metallization 70 forms a supporting element 90, wherein the converter element 10, via at least two supporting elements 90, is mechanically connected to the carrier substrate 26 and electrically linked to at least two lines 24 of the carrier substrate 26. At least two semiconductor regions 22 can be connected to one another by means of at least one wiring structure 52b. A thermal radiation from the carrier substrate 26 with the at least one conductor track 14 into the at least one converter element 10 can be reliably prevented by means of the reflector structures 52c. At the same time, the thermal radiation incident from that side of the converter element 10 which faces away from the carrier substrate is reflected back by the reflector structures 52c and thus has an increased probability of being absorbed in the converter element 10. The reflector structures 52c thus improve the optical detection accuracy of the finished converter element 10. The reflector structures 52c can simultaneously be effective as a getter layer in order to reduce a basic pressure during/after capping of the semiconductor device. The suspension structures 52a and the wiring structures 52b are preferably electrically insulated from the reflector structures 52c. However, the embodiment of the conductive structures 52 represented in FIG. 3 should be interpreted merely by way of example.

It is pointed out that the at least one semiconductor region 22 of the at least one converter element 10 and the conductive structures 52 formed on the at least one converter element 10 are completely embedded into at least one insulating material 92. In the case of an embodiment of the at least one converter element 10 as IR sensor element, silicon dioxide is preferably used as insulating material 92. Silicon dioxide absorbs infrared radiation with a good efficiency in a wide range of the infrared spectrum. Preferably, the insulating material 92 is opened only in the region of the suspension structures 52c with which contact is to be made for the bonding connection 70. This ensures the advantages—already described above—of the passivation of the at least one converter element 10 and of the conductive structures 52 formed thereon. In particular, leakage currents and short circuits are largely prevented. Moreover, the elastically brittle passivation results in a higher mechanical robustness of the conductive structures 52, which otherwise readily deform plastically on account of a plastic ductility of their metals.

In the case of the embodiment in FIG. 3, the conductive structures 52 formed on the at least one converter element 10 are formed on a side of the semiconductor regions 22 of the assigned converter element 10 that is oriented toward the carrier substrate 26. This arrangement of the conductive structures 52 on a side of the at least one converter element 10 that faces away from the light incidence affords the advantage that the at least one converter element 10 is not shaded by the conductive structures 52. As a result of the arrangement of the conductive structures 52 of the at least one converter element 10 in that region thereof which is oriented toward the carrier substrate 26, it is also possible to achieve a larger area filling factor of the at least one converter element 10, a higher integration density and a higher sensitivity of the at least one converter element 10. Moreover, there is a high design freedom for the outer side 72 of the converter element 10 facing the light incidence. In an alternative embodiment, therefore, conductive structures 52 such as e.g. plasmonic resonance structures can also be arranged on the outer side 72 of the at least one converter element 10, said outer side facing the light incidence.

In the case of the semiconductor device in FIG. 3, the at least one supporting element 90 has at least one bonding connection 70 formed from copper and tin by means of an SLID bonding method (solid-liquid interdiffusion). As an alternative thereto, the at least one supporting element 90 can also be fixed to the carrier substrate 26 by means of some other (conductive) connection.

Preferably, a length of one of the supporting elements 90 in each case is greater than a distance between the assigned converter element 10 and the carrier substrate 26. A length of a supporting element 90 can be, for example, four times as long as a gap height of the distance. The longer and narrower the supporting structures 90, the better an achieved thermal insulation of the at least one converter element 10 from the carrier substrate 26. Preferably, the linking of the at least one converter element 10 to the carrier substrate 26 is punctiform. This ensures that the at least one converter element 10 has a good thermal insulation with respect to the carrier substrate 26. Moreover, it is possible to improve the thermal decoupling by a vacuum enclosure by means of a capping.

Figure 4:
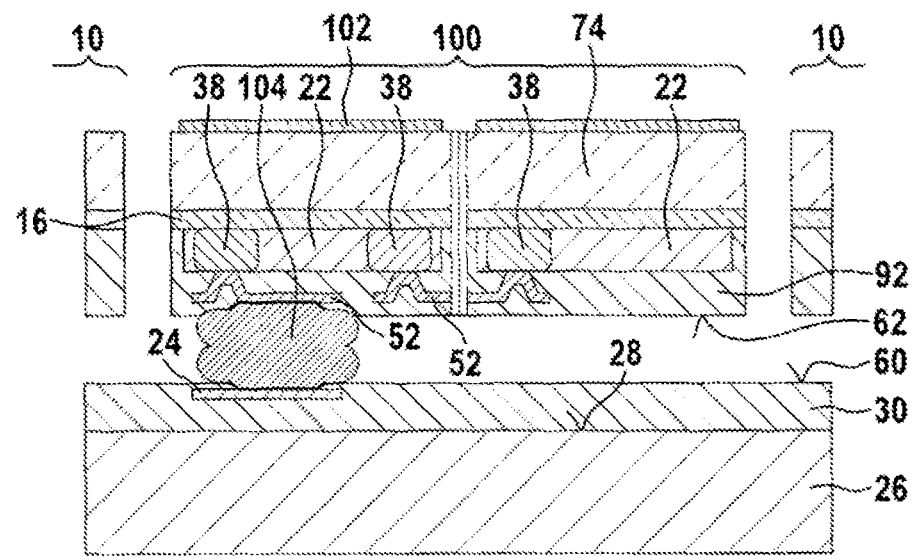
FIG. 4 shows a schematic illustration of a second embodiment of the semiconductor device.

FIG. 4 shows a schematic illustration of a second embodiment of the semiconductor device.

The semiconductor device represented schematically in FIG. 4 is a development of the embodiment described above. For this purpose, the semiconductor device in FIG. 4 comprises at least one blind pixel 100 in addition to the at least one converter element 10 embodied as image pixel. As an addition to the at least one converter element 10, the at least one blind pixel 100 also has at least one reflector layer 102 on its absorber layer 74/light incidence area.

By means of the at least one blind pixel 100, the thermal radiations emerging from the carrier substrate 26 and/or a spatial environment can be detected, determined or measured. It is therefore advantageous if the at least one blind pixel 100 has a good thermal linking to the carrier substrate 26. Preferably, the blind pixel 100 can be mechanically connected to the carrier substrate 26 via at least one linking structure 104 whose length is scarcely/not greater than a distance between the sides 60 and 62. In particular, the linking structure 104 can comprise at least two electrical leads and/or be formed at least partly from a material having a good thermal conductivity. In one preferred embodiment, the linking between the blind pixel 100 and the carrier substrate 26 is embodied in an areal fashion. Consequently, a heat emerging from the carrier substrate 26 with the at least one conductor track 14 can be reliably determined as reference signal by means of the at least one blind pixel 100.

Figure 5:
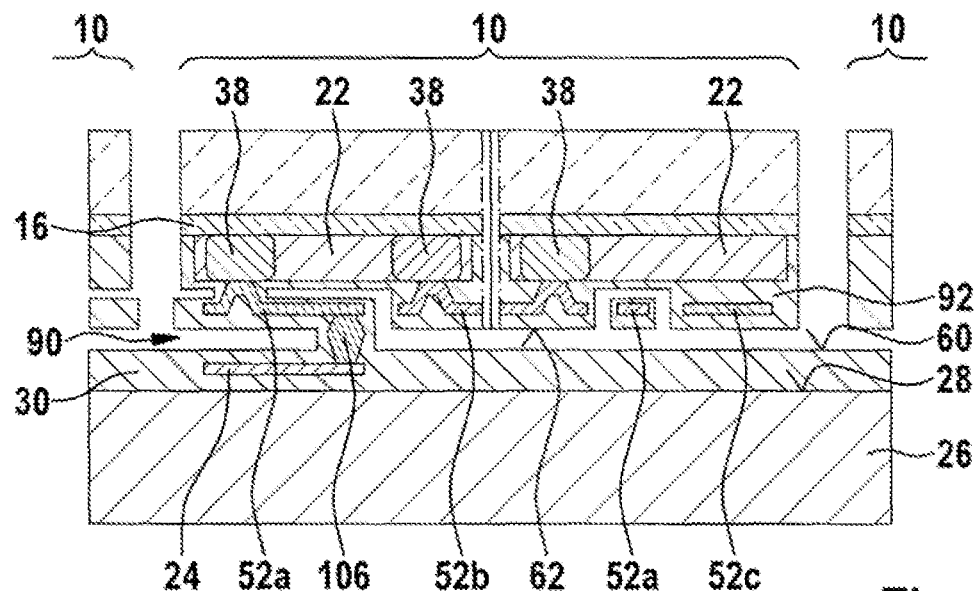
FIG. 5 shows a schematic illustration of a third embodiment of the semiconductor device.

FIG. 5 shows a schematic illustration of a third embodiment of the semiconductor device.

In the case of the embodiment in FIG. 5 as well, the semiconductor device comprises at least one converter element 10 embodied as optical sensor element (infrared sensor element) and/or image pixel. In particular, each of the converter elements 10 comprises at least one thermal diode which is formed by means of the dopings 38 in the semiconductor regions 22 and which is infrared-sensitive, or temperature-sensitive.

As an alternative to the embodiments described above, the at least one supporting element 90 comprises a thermocompression bond 106 composed of copper or gold.

Figure 6:
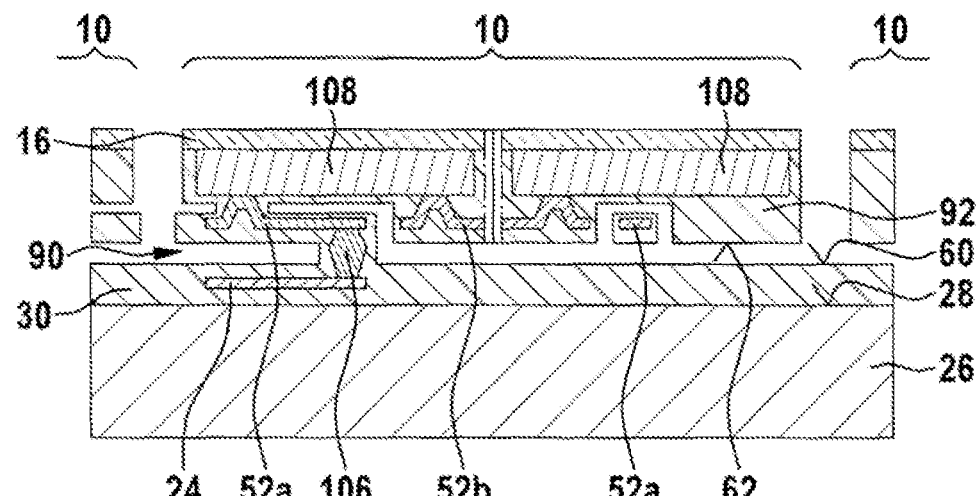
FIG. 6 shows a schematic illustration of a fourth embodiment of the semiconductor device.

FIG. 6 shows a schematic illustration of a fourth embodiment of the semiconductor device.

In the case of the semiconductor device illustrated in FIG. 6, the thermally sensitive regions 108 are formed from a thermistor material. The at least one converter element 10 preferably comprises a plurality of quantum films (not depicted) which are oriented in such a way that the maximum interfaces of the quantum films are oriented perpendicularly to the contact side 60 and/or an outer surface 28 of the carrier substrate 26, said outer surface being oriented toward the at least one converter element 10. This arrangement of the quantum films makes it possible for many quantum films to be produced cost-effectively by means of only one deposition and thus for a particularly high sensitivity of the thermistor to be achieved cost-effectively. Consequently, the semiconductor device in FIG. 6 ensures the advantages already described above.

In all of the semiconductor devices described above, surface leakage currents are prevented by a passivation of the surfaces of the converter elements 10. In order to increase a sensor signal it is additionally possible for a plurality of diodes, or heterostructure thermistors to be connected in series within the converter elements 10.

The semiconductor devices described above can be used for the spatially resolved detection of thermal radiation. In particular a high-precision temperature measurement is possible by means of the semiconductor devices. By way of example, the semiconductor devices can be used for motor vehicle night vision devices. The semiconductor devices can also be used for thermography, for example for the purpose of building insulation or process monitoring. The semiconductor devices can be used in particular for simple thermography cameras, for example for the purpose of insulation or for determining heat leaks.

What is claimed is:

1. A semiconductor device comprising:
   a carrier substrate including at least one conductor track; and
   at least one converter element including (i) at least one semiconductor region structured at least partly from a further semiconductor substrate, and (ii) conductive structures formed on a respective converter element of the at least one converter element, the at least one converter element being electrically linked to the at least one conductor track via at least one at least partly conductive supporting element located between a contact side of the carrier substrate and an inner side of the at least one converter element, the inner side being oriented toward the carrier substrate,
   wherein the at least one converter element is located on the contact side of the carrier substrate via the at least one at least partly conductive supporting element such that the inner side of the at least one converter element is kept spaced apart from the contact side of the carrier substrate via an air gap, and
   wherein the at least one semiconductor region of the at least one converter element and the conductive structures formed on the at least one converter element are completely embedded into at least one insulating material.

2. The semiconductor device according to claim 1, wherein the at least one at least partly conductive supporting element includes at least one bonding connection.

3. The semiconductor device according to claim 1, wherein:

the conductive structures formed on the at least one converter element are formed on a side of the at least one semiconductor region of the respective converter element, and the side is oriented toward the carrier substrate.

4. The semiconductor device according to claim 1, wherein the at least one converter element includes at least one of an optical sensor element and an image pixel.

5. The semiconductor device according to claim 4, wherein the at least one converter element includes at least one diode configured to enable temperature measurements.

6. The semiconductor device according to claim 1, wherein the at least one at least partly conductive supporting element forms a punctiform link between the at least one converter element and the carrier substrate.

7. The semiconductor device according to claim 1, wherein the at least one insulating material into which the at least one converter element is completely embedded is exclusively silicon dioxide.

8. The semiconductor device according to claim 4, wherein:

the at least one converter element includes in each case a plurality of quantum films oriented such that the maximum interfaces of the quantum films are oriented perpendicularly to at least one of (i) the contact side of the carrier substrate, and (ii) an outer surface of the carrier substrate, the outer surface of the carrier substrate being oriented toward the at least one converter element.

9. The semiconductor device according to claim 4, wherein:

the at least one converter element includes an absorber layer formed on an outer side of the respective converter element, and the outer side of the respective converter element is directed away from the carrier substrate.

10. A production method for a semiconductor device comprising:

forming at least one converter element on which conductive structures are formed, wherein at least one semiconductor region of the at least one converter element is structured at least partly from a semiconductor substrate; and linking the at least one converter element to a carrier substrate with at least one conductor track, wherein the at least one conductor element is electrically linked to the at least one conductor track via at least one at least partly conductive supporting element arranged between a contact side of the carrier substrate and an inner side of the at least one converter element, the inner side being oriented toward the carrier substrate, wherein the at least one converter element is located on the contact side of the carrier substrate via the at least one at least partly conductive supporting element such that the inner side of the at least one converter element is kept spaced apart from the contact side of the carrier substrate via an air gap, and wherein the at least one semiconductor region of the at least one converter element and the conductive structures formed on the at least one converter element are completely embedded into at least one insulating material.

11. The production method according to claim 10, wherein the at least one converter element is linked to the carrier substrate by a bonding connection structure of the at least one at least partly conductive supporting element.

12. The production method according to claim 10, wherein the conductive structures formed on the at least one converter element are formed on a side of the at least one semiconductor region of the assigned converter element which is oriented toward the carrier substrate when the at least one converter element is linked to the carrier substrate.

13. The production method according to claim 10, wherein the at least one converter element includes at least one of an optical sensor element and an image pixel.

14. The production method according to claim 13, wherein at least one thermal diode is formed in the at least one converter element.

15. The production method according to claim 13, wherein:

in each case a plurality of quantum films are formed in the at least one converter element, the maximum interfaces of the plurality of quantum films, when the at least one converter element is linked to the carrier substrate, are oriented perpendicularly to at least one of (i) the contact side of the carrier substrate, (ii) an outer surface of the carrier substrate, and the outer surface of the carrier substrate is oriented toward the at least one converter element.

16. The production method according to claim 13, wherein:

an absorber layer is formed on an outer side of the at least one converter element, and the outer side is directed away from the carrier substrate.

\* \* \* \* \*